United States Patent
Fukuda et al.

(10) Patent No.: US 6,927,980 B2
(45) Date of Patent: Aug. 9, 2005

(54) COOLING STRUCTURE FOR DISK STORAGE DEVICE

(75) Inventors: Hiroshi Fukuda, Odawara (JP); Kenji Fujita, Odawara (JP)

(73) Assignee: Hitachi, Ltd., Tokyo (JP)

( * ) Notice: Subject to any disclaimer, the term of this patent is extended or adjusted under 35 U.S.C. 154(b) by 16 days.

(21) Appl. No.: 10/763,302

(22) Filed: Jan. 26, 2004

(65) Prior Publication Data

US 2004/0264133 A1 Dec. 30, 2004

(30) Foreign Application Priority Data

Jun. 27, 2003 (JP) .......................... 2003-183988

(51) Int. Cl.[7] ................................. H05K 7/20
(52) U.S. Cl. ................. 361/700; 165/80.4; 165/104.33; 62/259.2; 361/687; 361/685; 361/699
(58) Field of Search .............. 165/80.3, 80.4, 165/185, 104.33; 361/685, 687, 698–695, 699, 704–710, 715; 454/184; 62/259.2

(56) References Cited

U.S. PATENT DOCUMENTS

| | | | |
|---|---|---|---|
| 5,365,749 A | | 11/1994 | Porter |
| 5,842,514 A | * | 12/1998 | Zapach et al. ......... 165/104.33 |
| 5,898,569 A | * | 4/1999 | Bhatia ..................... 361/700 |
| 5,946,191 A | * | 8/1999 | Oyamada ................. 361/700 |
| 6,052,285 A | * | 4/2000 | Hileman .................. 361/699 |
| 6,115,251 A | | 9/2000 | Patel et al. |
| 6,144,553 A | * | 11/2000 | Hileman et al. ........... 361/687 |
| 6,181,553 B1 | * | 1/2001 | Cipolla et al. ............ 361/687 |
| 6,310,772 B1 | * | 10/2001 | Hutchison et al. ........ 361/700 |
| 6,349,031 B1 | | 2/2002 | Lin et al. |
| 6,560,107 B1 | | 5/2003 | Beck et al. |
| 6,608,751 B2 | | 8/2003 | Ishimine et al. |
| 6,643,132 B2 | * | 11/2003 | Faneuf et al. ............ 361/700 |
| 6,778,393 B2 | | 8/2004 | Messina et al. |
| 6,819,563 B1 | * | 11/2004 | Chu et al. ................. 361/696 |
| 2004/0190255 A1 | | 9/2004 | Cheon |

FOREIGN PATENT DOCUMENTS

JP       2001-156483       11/1999

\* cited by examiner

*Primary Examiner*—Gregory Thompson
(74) *Attorney, Agent, or Firm*—Reed Smith LLP; Stanley P. Fisher, Esq.; Juan Carlos A. Marquez, Esq.

(57) ABSTRACT

A disk drive box 10 accommodates a plurality of disk drives 20 within a case 11. A side face of each of the drives 20 is provided with a heat-absorbing part 40 including a heat pipe, corresponding to heat producing area HP. The heat taken away by the heat-absorbing part 40 is transmitted to a heat sink 50 of the rear of a backboard 30 via a heat connector 60. The heat sink 50 is cooled by cooling air flowing through an air duct 7. By cooling the drive 20 with the heat pipe, clearances between the drives 20 can be substantially eliminated, and it is made unnecessary to form an opening for air cooling in the backboard 30. Thus, size reduction is possible, and it is possible to increase the degree of freedom for a wiring pattern formed on the backboard 30.

13 Claims, 12 Drawing Sheets

(a)

(b)

COOLING STRUCTURE FOR DISK STORAGE DEVICE

CROSS REFERENCE TO RELATED APPLICATION

This application relates to and claims priority from Japanese Patent Application No. 2003-183988, filed on Jun. 27, 2003, the entire disclosure of which is incorporated herein by reference.

FIELD OF THE INVENTION

The present invention relates, for example, to a structure for cooling a disk storage device in which a plurality of disk drives are accommodated.

BACKGROUND OF THE INVENTION

A disk array apparatus for storing a large amount of data comprises a multiplicity of disk storage devices and the like connected with each other and provides, for example, a storage area in accordance with RAID (Redundant Array of Independent Inexpensive Disks). Each of disk storage devices comprises, for example, a plurality of disk drives, such as hard disk drives. The plurality of disk drives are mounted side by side and attached onto an electric circuit board for connection, called a "backboard." Because the disk drives generate heat while they are in use, the disk drives are conventionally cooled by feeding cooling air into the disk storage device. Specifically, the disk storage device is provided with a fan (for air blow or intake) for forced air cooling to supply cooling air to clearances between the disk drives. The cooling air that has removed heat from the disk drives is exhausted outside from an exhaust hole provided in the housing of the disk storage device, and thus the internal temperature is prevented from rising.

Another known method is a technique for carrying out cooling in which a flat plate-shaped heat pipe is attached to an electronic appliance to transport the heat of the electronic appliance to the outside of its housing through the heat pipe.

Conventionally, cooling of disk drives is carried out by forcibly supplying cooling air inside the housing, and therefore, it is necessary to have sufficient clearances between disk drives accommodated in the housing at a high density so as to form a flow path for the cooling air. As a result, the housing size of the disk storage device is likely to increase corresponding to the clearances allocated to the cooling air flow path, making it difficult to meet the market demands for size reduction.

In addition, in many cases, an opening for exhaust is formed in the backboard in order to exhaust the cooling air circulated through the clearances between disk drives to the outside of the disk storage device. The reason is that the cooling air can be relatively smoothly exhausted when an opening is formed in the backboard since the backboard is provided at the rear ends of the disk drives so as to lid the clearances between the disk drives. For this reason, in the case of cooling structure in which cooling air is supplied between the disk drives, a large number of openings are formed in the backboard according to the number of disk drives accommodated. The backboard is, however, not only for mechanically supporting the disk drives but its original purpose is to electrically connect the disk drives with each other. Specifically, the backboard has a wiring pattern formed thereon and connected to each of the disk-drives, and through the wiring pattern, such operations are performed that power is supplied to each of the disk drives and data are read/written. Accordingly, when a large number of openings are formed or a single opening having a large area is formed in the backboard, the wiring pattern must be formed so as to bypass such opening(s), forcing the wiring line length of the wiring pattern to be longer than is necessary. Moreover, the presence of such opening(s) restricts the area in which the wiring pattern can be formed, and therefore, the wiring pattern may be densely packed in a particular area. When a wiring line length is made longer than is necessary or the wiring pattern is densely packed extremely, adverse effects such as noise are likely to occur, reducing the electrical characteristics.

SUMMARY OF THE INVENTION

The invention has been accomplished in view of the foregoing problems, and an object is to provide a cooling structure for a disk storage device that cools effectively disk drives accommodated at a high density and can improve the degree of freedom for signal lines formed on a connection board. Other objects of the invention will become apparent from the description of preferred embodiments hereinbelow.

In order to solve the foregoing problems, a cooling structure for a disk storage device in accordance with the invention is for a disk storage device accommodating at least one disk drive, comprising: the disk storage device having a connection board to which the disk drive is electrically connected, such that data input/output to/from the disk drive is performed via a signal line formed on the connection board; a heat-absorbing part provided on the disk drive; a heat-dissipating part provided so as to be exposed outside the disk storage device; and a heat-transferring part for connecting the heat-absorbing part and the heat-dissipating part; wherein heat generated by the disk drive is transmitted from the heat-absorbing part via the heat-transferring part to the heat-dissipating part to radiate the heat, whereby an opening for air cooling is substantially eliminated from the connection board.

The disk drive is, for example, for storing data in a storage medium, such as a magnetic disk, a magneto optical disk, an optical disk, and a semiconductor memory. The disk storage device accommodates at least one disk drive in the housing. The disk storage device also has a connection board formed as, for example, a printed circuit board, and this connection board has a signal line for performing data read from/write to the disk drive, formed thereon. The cooling structure for the disk storage device comprises a heat-absorbing part, a heat-dissipating part, and a heat-transferring part. The heat-absorbing part includes, for example, a heat pipe or the like and provided on a surface of the disk drive, and absorbs heat generated by the disk drive. The heat-dissipating part is provided, for example, so as to be exposed outside of the housing of the disk storage device. The heat-dissipating part may be provided for each of the disk drives, or may be provided collectively for a set of plurality of disk drives. The heat-transferring part thermally connects the heat-absorbing part and the heat-dissipating part with each other. The heat absorbed by the heat-absorbing part is transferred via heat-transferring part to the heat-dissipating part and is radiated from the heat-dissipating part.

The cooling structure in accordance with the invention does not perform cooling by forcible air cooling using fans or the like, but rather utilizes the heat conduction through the heat-absorbing part, the heat-transferring part, and the heat-dissipating part, in order to perform cooling. For this reason, it is unnecessary to form a flow path for letting cooling air flow therethrough within the disk storage device, and it is also unnecessary to provide an opening for air cooling in the connection board. As a result, the degree of freedom for the signal line formed on the connection board can be increased, and adverse effects such as noise can be reduced; thus, cooling performance and electrical characteristics can be improved. Moreover, because the clearances for cooling air can be eliminated, size reduction of the device as a whole is possible. Here, the phrase "an opening for air cooling is substantially eliminated from the connection board" means that no openings are formed for the particular purpose of air cooling. For example, in some cases, openings such as screw holes for mounting and small holes for fitting the heat-dissipating part etc. are formed in the connection board for other purposes than the purpose of air cooling. It should be noted that the meaning can be expressed by "the connection board is formed so as to attain a substantially hermetically sealed state."

When a plurality of disk drives are accommodated in the disk storage device, it is possible to employ a configuration such that substantially no clearance for air cooling exists between the disk drives and between the disk drives and a housing of the disk storage device.

In one embodiment of the invention, the heat-transferring part separably comprises a heat-absorbing-side heat-transferring part coupled to the heat-absorbing part and provided at the disk drive side, and a heat-dissipating-side heat-transferring part coupled to the heat-dissipating part and provided at the connection board side. By allowing the heat-transferring part to have a separable configuration, the disk drive can be attached to/detached from the housing.

The heat-absorbing-side heat-transferring part and the heat-dissipating-side heat-transferring part may be in surface contact with each other at a plurality of locations to transfer heat. For example, when the heat-absorbing-side heat-transferring part and the heat-dissipating-side heat-transferring part are configured as a heat connector with a comb tooth-shaped structure, the contact area is enlarged by fitting their respective plurality of flat plate-shaped protrusions with each other; thus, heat can be transferred more effectively.

In one embodiment of the invention, the heat-absorbing part is distributedly disposed corresponding to heat producing areas of the disk drive. In other words, the heat-absorbing part is spread out in locations of the entire surface of the disk drive, whose temperature is likely to be elevated. By distributedly dispose the heat-absorbing part, cooling is performed only at necessary locations.

In another embodiment of the invention, the heat-absorbing part is provided so as to cover a surface of the disk drive. The phrase "so as to cover a surface" does not only mean such a case in which the entire surfaces are covered, but means to include such a case in which any one of the surfaces of the disk drive is substantially covered. Preferably, the heat-absorbing part is provided so as to cover a wider area including the heat producing area of the disk drive. The heat-absorbing part may be formed in various shapes, such as a plate shape, a network-like shape, and so forth.

In one embodiment of the invention, a cooling mechanism for removing heat radiated from the heat-dissipating part is further comprised. The cooling mechanism may be configured as either an air-cooling system or liquid-cooling system (refrigerant system) cooling mechanism. By including a cooling mechanism for removing the heat from the heat-dissipating part, the disk drive can be more effectively cooled.

In one embodiment of the invention, a control board for controlling operation of the disk drive is provided in the disk storage device, the control board being connected to the connection board; a signal line for connecting the control board and the disk drive is formed on the connection board; and the signal line is formed so as to substantially linearly connect an electrical connector unit between the disk drive and the connection board, with an electrical connector unit between the control board and the connection board. Specifically, with the invention, the signal line can be substantially linearly formed and the wiring line length can be reduced since substantially no opening for air cooling is formed in the connection board.

In one embodiment of the invention, a plurality of compartments are formed vertically within a housing of the disk storage device, and in each of the compartments, a plurality of the disk drives are disposed substantially in close contact with each other. When a multiplicity of disk drives are accommodated at a high density, the degree of freedom for signal lines can be increased while the disk drives are cooled effectively with the invention because substantially no opening for air cooling needs to be formed.

In accordance with another aspect, the invention provides a disk array apparatus comprising: a plurality of disk storage devices for connecting a plurality of disk drives to a connection board having a signal line for electrically connecting the disk drives with each other, and for accommodating the disk drives substantially in close contact with each other; a device housing for accommodating the disk storage devices; a cooling mechanism provided in the device housing; heat-absorbing parts respectively provided for the disk drives; at least one heat-dissipating part provided so as to be exposed outside of the disk storage devices; and a heat-transferring part for connecting the heat-absorbing parts and the heat-dissipating part with each other; wherein heat generated by the disk drives is transmitted from the heat-absorbing parts via the heat-transferring part to the heat-dissipating part and is radiated from the heat-dissipating part via the cooling mechanism, whereby substantially no opening for air cooling is formed in the connection board.

In accordance with still another aspect, the invention provides a cooling structure for a unit-accommodating enclosure accommodating at least one unit having a heat producing area inside, comprising: the unit connected to a connection board on which an information transmission path is formed such that information input/output to/from the unit is performed via the information transmission path; a heat-absorbing part provided on the unit; a heat-dissipating part provided so as to be exposed outside the unit-accommodating enclosure; and a heat-transferring part for connecting the heat-absorbing part and the heat-dissipating part; wherein heat generated by the unit is transmitted from the heat-absorbing part via the heat-transferring part to the heat-dissipating part and is radiated therefrom, whereby an opening for air cooling is substantially eliminated from the connection board.

BRIEF DESCRIPTION OF THE DRAWINGS

Preferred embodiments of the invention will now be described in conjunction with the accompanying drawings, in which:

FIGS. 9A and 9B show a disk array box in which an air-cooling system cooling structure is adopted, wherein FIG. 9A is an exterior view, viewed from its front face and FIG. 9B is an exterior view, viewed from the rear;

DESCRIPTION OF THE PREFERED EMBODIMENTS

With reference to FIGS. 1 through 12, preferred embodiments of the present invention are described below.

[1. First Embodiment]

Figure 1:
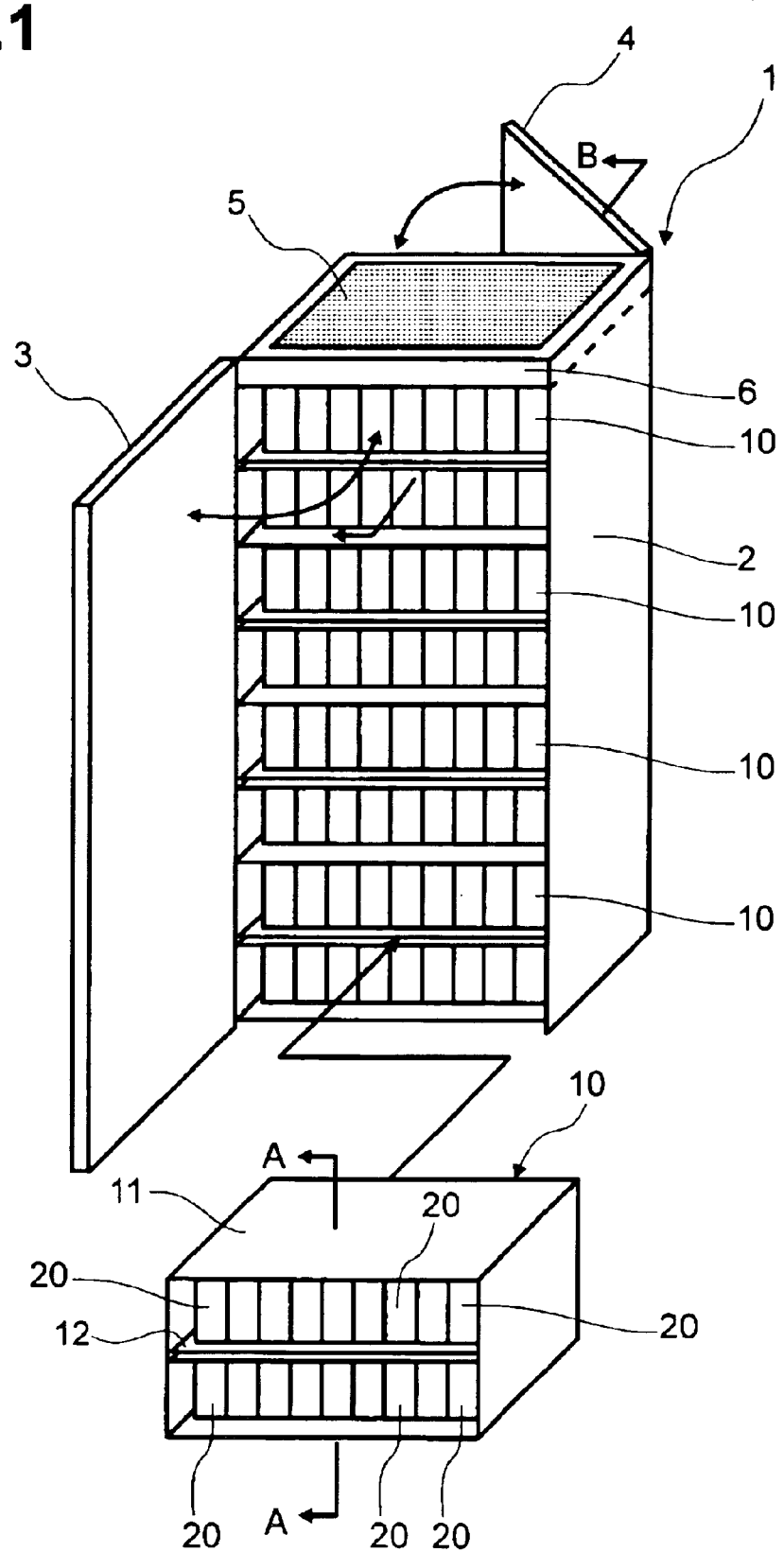
FIG. 1 is an exterior view showing the entire disk array apparatus.

With reference to FIGS. 1 through 8, a first embodiment of the invention is described. FIG. 1 shows an exterior view showing the entirety of a disk array apparatus 1. The disk array apparatus 1 comprises a plurality of disk drive boxes (hereafter referred to as "box/boxes") 10 stacked on top of each other in a rack 2. Although the details will be described later, each box 10 has a case 11 that is partitioned into two compartments separated vertically, with a control board 12 defining their boundary, and each of the compartments detachably/reattachably accommodates a plurality of disk drives 20 that are substantially in close contact with each other.

The front and rear of the rack 2 are opened, and a front door 3 and a back door 4, which are openable/closable, are provided respectively for the front opening and the rear opening. Within the rack 2, a plurality of the boxes 10 are accommodated detachably/reattachably, and in each of the front part and rear part, they are stacked on top of each other so as to form a symmetrical structure. Each of the boxes 10 accommodated in the front part of the rack 2 can be accessed by opening the front door 3, while each of the boxes 10 accommodated in the rear part of the rack 2 can be accessed by opening the rear door 4 so that maintenance work etc. can be carried out. It is possible to adopt a configuration that accommodates a control module for integrally managing data input/output to/from each of the boxes 10, a power supply module for supplying regular power to each of the boxes 10, a battery module for supplying emergency power to each of the boxes 10, and the like.

As will be described later with reference to FIG. 6, an air duct 7 is formed so as to extend vertically (along the vertical direction) within the rack 2, and a top cover 5 having air permeability is attached on the upper opening thereof, which serves as an exhaust opening for the air duct 7. A cooling machine room 6 containing air intake fans 8 is provided below the top cover 5 and in the upper part of the rack 2. Thus, in the rack 2, a plurality of compartments are defined to be on top of each other, and in each of the compartments, a front-side box 10 and a rear-side box 10 are placed back to back with the air duct 7 interposed therebetween. The heat produced from each of the boxes 10 is taken away by the cooling air that flows through the air duct 7 to the outside of the rack 2.

Figure 2:
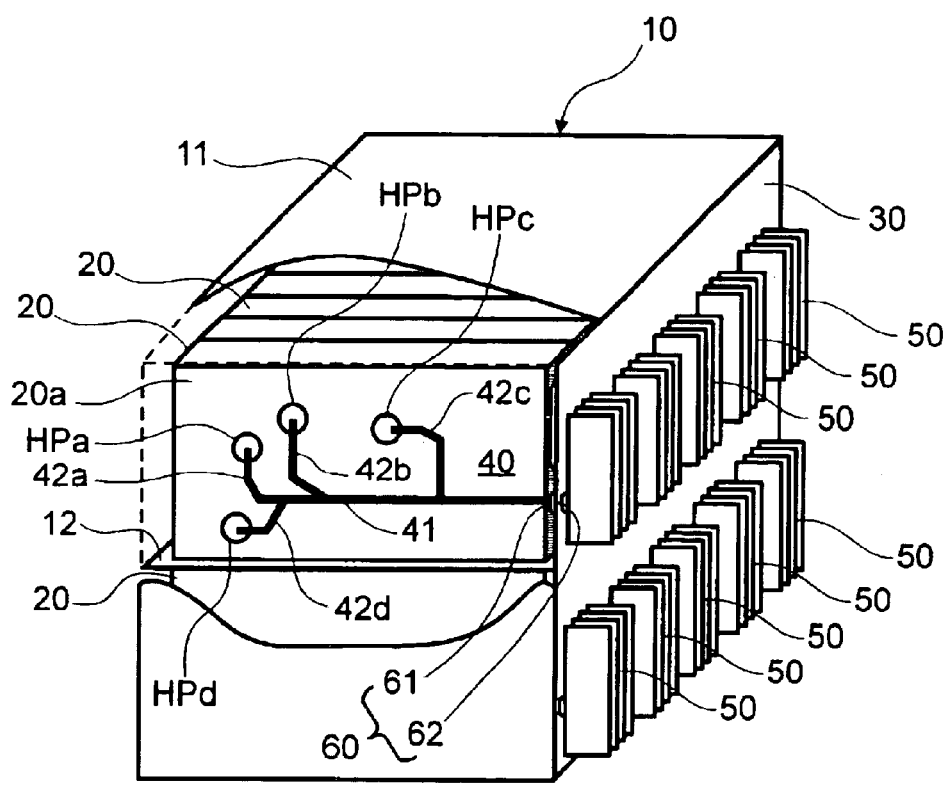
FIG. 2 is an exterior view showing a disk drive box a portion of which is cut away for illustration.
Figure 3:
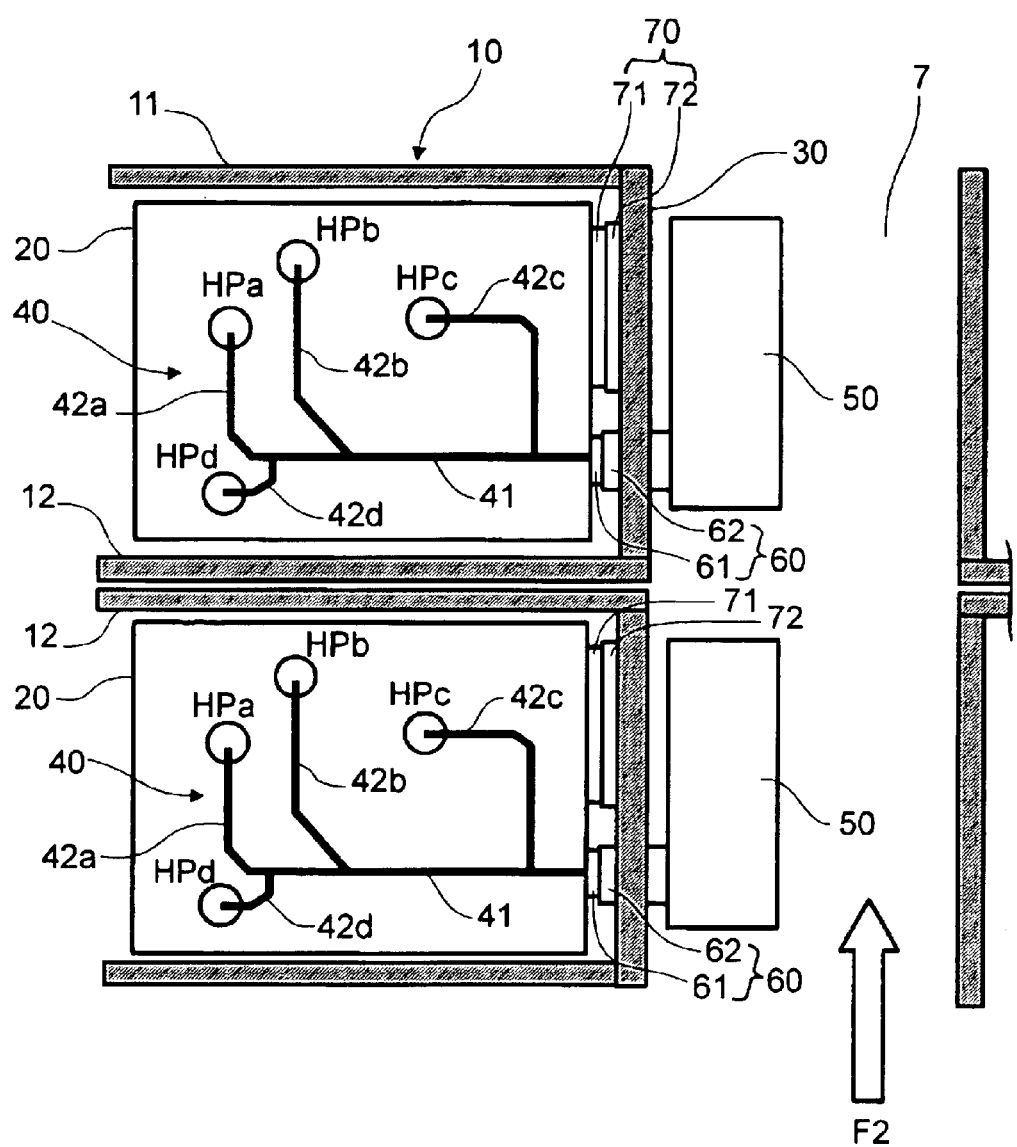
FIG. 3 is a cross-sectional view showing the disk drive box assembled into a rack, taken along the line A—A in FIG. 1.

With reference to FIGS. 2 and 3, the details of the box 10 are described. FIG. 2 is an exterior view showing a box 10 a portion of which is cut away for illustration. FIG. 3 is a cross-sectional view showing the box 10 assembled into the rack 2, taken along the line A—A in FIG. 1. The box 10 comprises, for example, a case 11 formed into a hollow rectangular prism-like shape and made from a sheet metal or the like, a control board 12 fitted so as to partition the inside of the case 11 vertically into two compartments, and a plurality of disk drives 20 accommodated respectively in the compartments in the case 11.

Although the case 11 is not necessarily formed of a metal material, it can exhibit high cooling performance by using, for example, a material having a high heat conductivity such as an aluminum alloy, when it is connected to a later-described cooling structure for the disk drives 20. On the other hand, by using a material having electro magnetic shielding performance, the case 11 can function as an anti-EMI (Electro Magnetic Interference) component. The control board 12 is for controlling the interfaces between the disk drives 20, and separate control boards 12 are respectively provided for the upper group of the disk drives and the lower group of the disk drives. Data input/output to/from each of the disk drives 20 is-performed through a control board 12 that is assigned to that disk drive 20.

The disk drives 20 are accommodated so as to be substantially in close contact with each other, and there are substantially no clearances for cooling air between the disk drives 20 and between the disk drives 20 and the inner surface of the case 11. Specifically, if a magnified observation is made, it will be seen that slight clearances exist between the disk drives 20 and between the disk drives 20 and the case 11, but these clearances are not the spaces for actively causing cooling air to flow therethrough. It should be noted that these clearances are clearances necessary for mounting and fabrication, and are not the spaces for air cooling.

The rear of the case 11 is lidded by a backboard 30. The backboard 30 is electrically connected to each of the disk drives 20 and each of the control boards 12, and it is a printed circuit board on which a wiring pattern for transmitting electrical signal to the disk drives 20 and the control boards 12 is formed. As shown in FIG. 3, the front side of the backboard 30 is provided with a signal connector 70 for electrical connection with the disk drives 20, and the rear side of the backboard 30 is provided with heat sinks 50 protruding inside the air duct 7. A connector 12a for electrically connecting the control board 12 and the backboard 30 will be described later. The signal connectors 70 and 12a are configured to transmit data and power.

Figure 4:
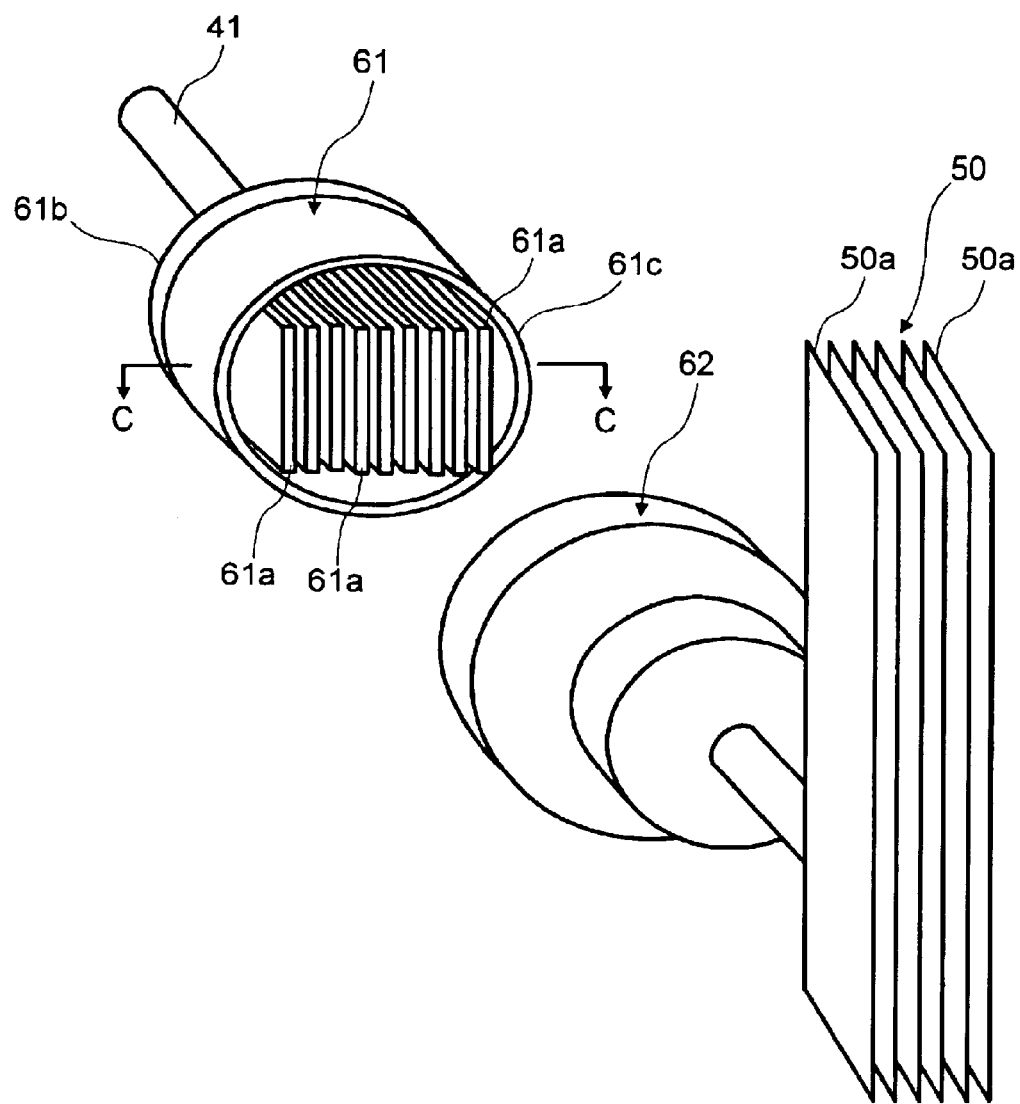
FIG. 4 is an exterior view of a heat connector and a heat sink that are shown enlarged.

Each heat sink 50 is formed of, for example, a material having a high heat conductivity, such as an aluminum alloy, and has a plurality of fins 50a (see FIG. 4). Each of the fins 50a is set so as to be substantially parallel to the direction of cooling air F2, flowing through the air duct 7 upwardly from below. The heat sink 50 needs not be provided for every one of the disk drives 20, and instead, each one of plurality of the disk drives 20 may be provided with a heat sink.

Alternatively, each one of the compartments may be provided with one heat sink, or the entire box 10 may be provided with one heat sink.

Each of the disk drives 20 is configured as, for example, a hard disk drive, and comprises a plurality of magnetic disks (platters), a magnetic head for performing data read/write on both surfaces of the magnetic disks, a carriage mechanism for shifting the magnetic head to a predetermined position, and a controller section including a cache memory, a control circuit, and the like. A logical volume (Logical Unit) is formed above the physical storage areas provided by the disk drives. A host computer, which is not shown in the drawings, is connected via a communication network such as SAN (Storage Area Network) and is configured to instruct the logical volume to store data or to read data.

Each of the disk drives 20 is formed into, for example, a thin rectangular shape, and one side face 20a thereof is provided with a heat-absorbing part 40. The heat-absorbing part 40 includes, for example, a trunk portion 41 and branch portions 42a to 42d (also collectively referred to as "branch portion 42"), together forming a tree-like shape. Preferably, the heat-absorbing part 40 is configured as a heat pipe. The heat pipe is a heat transport means such that a heat transport medium, such as water, is enclosed in a hermetically sealed and evacuated tube, and networks and grooves for utilizing the capillary phenomenon are formed on the inner wall of the tube. At one end of the heat pipe, the heat transport medium takes latent heat away and vaporizes, and at the other end of the heat pipe, the heat transport medium radiates heat and becomes liquid. The heat transport medium that has become liquid returns to the original end, traveling through the networks and grooves.

The trunk portion 41 of the heat-absorbing part 40 is formed so as to extend longitudinally along the side face 20a of the disk drive 20. The respective branch portions 42a to 42d are respectively branched from mid portions of the trunk portion 41, extending toward respective heat producing areas HPa to HPd. The base end of the trunk portion 41 (the end toward the rear of the disk drive 20) is connected to a heat connector 60. The respective heat producing areas HPa to HPd (also collectively referred to as "heat producing area HP") represent locations where the temperature is likely to be elevated in the disk drive 20. When the area of the high temperature area is wide or when the temperature thereof is high etc., a plurality of branch portions 42 may be employed for cooling.

The heat absorbed by the branch portions 42 is transported to the heat connector 60 via the trunk portion 41, and is transmitted from the heat connector 60 to the heat sink 50. The heat transmitted to the heat sink 50 is transferred to the cooling air F2 via a multiplicity of fins 50a, and is transported to the outside of the rack 2 by the cooling air F2.

The signal connector 70 separably includes a drive-side connector 71 fitted to the disk drive 20 side and a board-side connector 72 fitted to the backboard 30. Likewise, the heat connector 60 separably includes a heat-absorbing-side heat connector 61 provided on the disk drive 20 side and a heat-dissipating-side heat connector 62 provided on the backboard 30 side. Thus, each of the disk drives 20 can be pulled out of the box 10 to carry out work for replacement or the like.

FIG. 4 is a perspective view showing a heat connector 60 enlarged. The heat connector 60 may be configured as, for example, a comb tooth-like connector. Specifically, as shown also in FIG. 5, which is a cross-sectional view taken along the line C—C in FIG. 4, the heat-absorbing-side heat connector 61 and the heat-dissipating-side heat connector 62 are formed in substantially a hollow cylindrical shape respectively having a multiplicity of tooth portions 61a and 62a, and by fitting the tooth portions 61a and 62a together and bring them in contact with each other, and therefore heat is transmitted from the heat-absorbing side to the heat-dissipating side.

Figure 5:
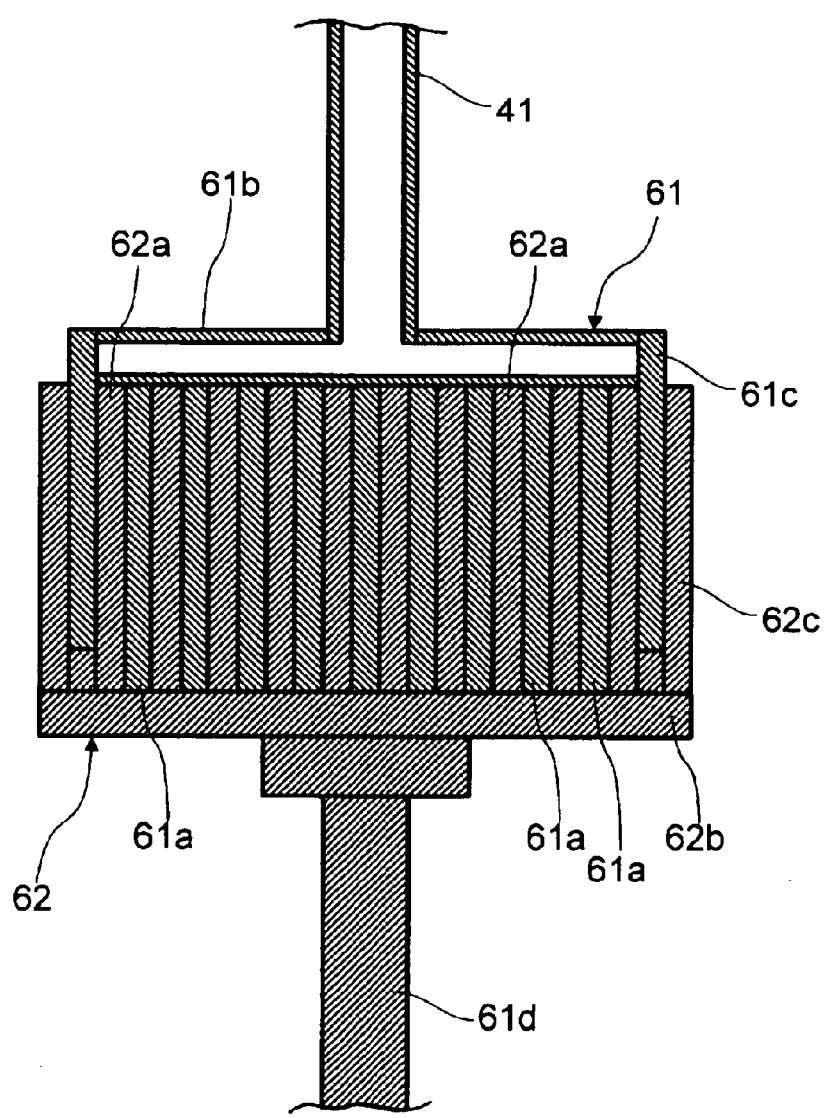
FIG. 5 is a cross-sectional view of the heat connector, taken along the line C—C in FIG. 4.

More details are described with reference to FIGS. 4 and 5. The heat-absorbing-side heat connector 61 comprises: a disk-like shaped base unit 61b coupled to the base end side of the trunk portion 41 of the heat-absorbing part 40; a plurality of tooth portions 61a integrally formed with and protruding from a surface of the base unit 61b, which are aligned parallel to each other at predetermined intervals; and a cover 61c formed protrudingly on the outer peripheral side of the base unit 61b so as to surround the tooth portions 61a from outside. Likewise, the heat-dissipating-side heat connector 62 comprises: a disk like-shaped base unit 62b; a plurality of tooth portions 62a formed integrally with and protruding from a surface of the base unit 62b, which are aligned parallel to each other at predetermined intervals; a cover 62c formed protrudingly on the outer peripheral side of the base unit 62b so as to surround the tooth portions 62a from outside; and a shaft 61d formed protruding from substantially the center of the base unit 62b and coupled to the heat sink 50. When heat-absorbing-side heat connector 61 and the heat-dissipating-side heat connector 62 are assembled together, the respective tooth portions 61a and 62a are fitted with each other so that the respective mating tooth portions adjacent thereto are brought into surface contact with each other.

The heat transfer process is now discussed. The heat transport medium, which has taken heat away from the heat producing area HP and has vaporized, flows from the branch portion 42 via the trunk portion 41 into the base unit 61b of the heat-absorbing-side heat connector 61. The base unit 61b serves as a condenser, and the heat transport medium is deprived of its heat and turned into liquid. The heat transferred from the heat transport medium to the base unit 61b is conducted from the base unit 61b to each of the tooth portions 61a. The heat transferred to the tooth portions 61a of the heat-absorbing side is transported, by means of heat conduction, to the tooth portions 62a of the heat-dissipating side due to their surface contact. Additionally, in some cases, the heat is conducted through very small clearances between the tooth portions 61a and 62b, or transferred by means of infrared radiation. Depending on the circumstances, it is possible to improve heat conduction by means of surface contact by interposing a substance having a good heat conductivity, such as heat conductive grease, between the tooth portions 61a and 62a to eliminate the clearances therebetween. Also, the tooth portions 61a and 62a are not limited to the configuration in which they are formed in a thin-walled plate shape and aligned parallel to each other; the tooth portions 61a and 62a may be formed into thin-walled, coaxial hollow cylindrical shapes. Moreover, it is possible to employ a configuration in which the respective tooth portions 61a and 62a are designed to have different thermal expansion coefficients in order to generate a force by which the tooth portions 61a and 62a are pressed against each other so that the tooth portions 61a and 62a are brought into surface contact by applying a pressure thereto in a diametric direction. Furthermore, although it has been described that only the heat-absorbing part 40 is configured as a heat pipe and the heat connector 60 transports heat primarily by means of heat conduction utilizing the surface contact, it is also possible to configure the entirety including the heat connector 60 as a heat pipe. It is also possible to configure a heat pipe including the heat sink 50. In this case, however, it is preferable that the heat connector 60 should have a separable configuration from the viewpoint of maintenance work.

Figure 6:
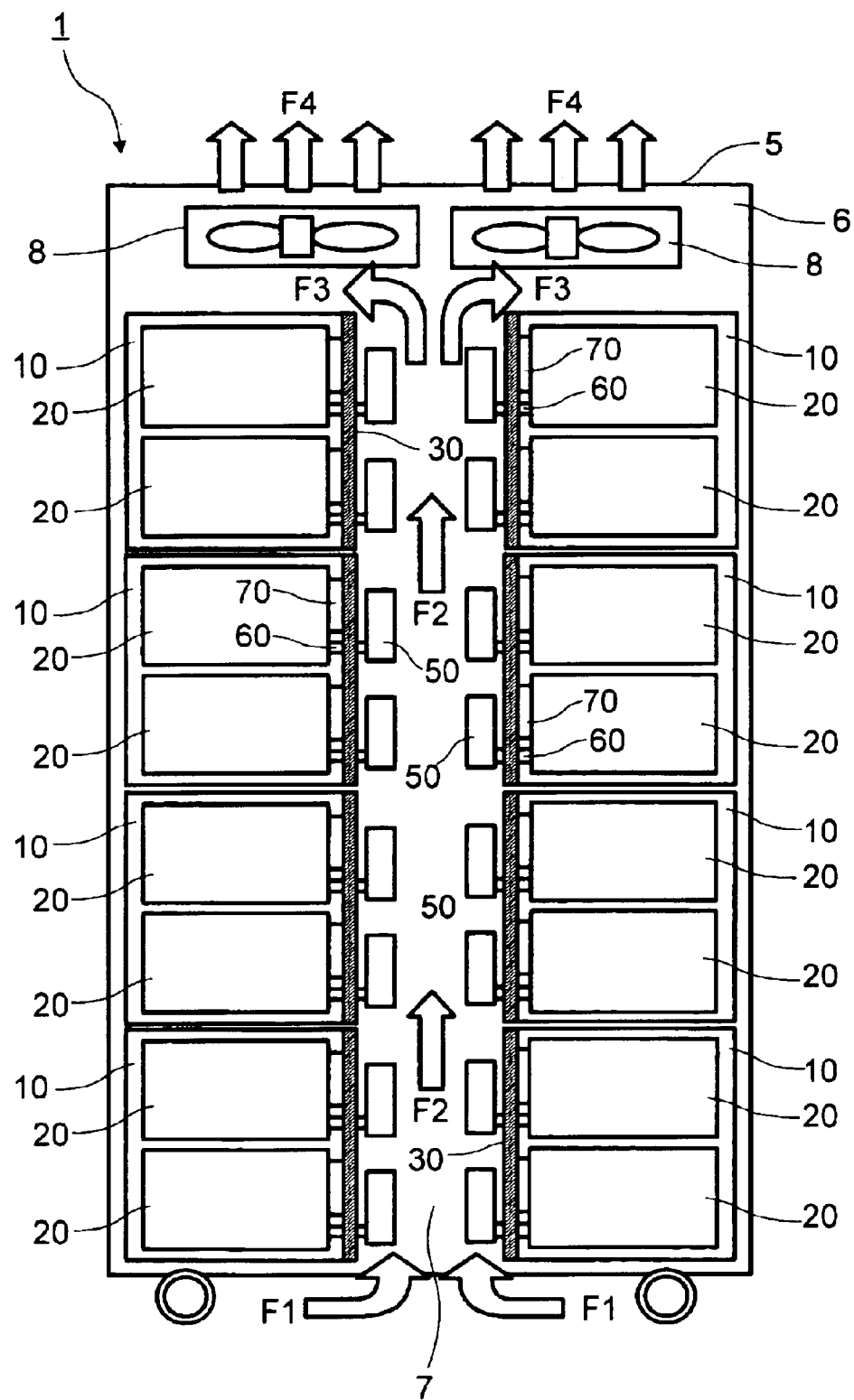
FIG. 6 is across-sectional view of a disk array apparatus, taken along the line B—B in FIG. 1.

FIG. 6 is a schematic cross-sectional view taken along the line B—B in FIG. 1. As described previously, in the rack 2, the boxes 10 disposed opposing each other back to back are accommodated so as to be stacked on top of each other, and the backboards 30 of the respective boxes 10 are exposed into the air duct 7 within the rack 2. Accordingly, the heat sinks 50 attached so as to protrude from the rear side of the backboards 30 protrude inside the air duct 7. The bottom part of the air duct 7 is opened at the bottom face of the rack 2 to form an air inlet, and the upper part of the air duct 7 is provided with the cooling machine room 6. The cooling machine room 6 is provided with a plurality of air intake fans 8, and the suction force of the fans 8 generates cooling air F inside the air duct 7, which travels upward from the bottom. Specifically, when the fans 8 rotate and the pressure within the air duct 7 reduces, cooling air F1 flows into the air duct 7 from the air inlet in the bottom face of the rack. The cooling air F1, which has flowed into the air duct 7, becomes cooling air F2 that flows through the air duct 7 upward. The cooling air F2 removes the heat radiated from the heat sinks 50 as it travels through the air duct 7. When reached the cooling machine room 6, the cooling air F2 is sucked by the fans 8 (F3) and is exhausted from the fans 8 via the top cover 5 to the outside of the rack 2 (F4).

Figure 7:
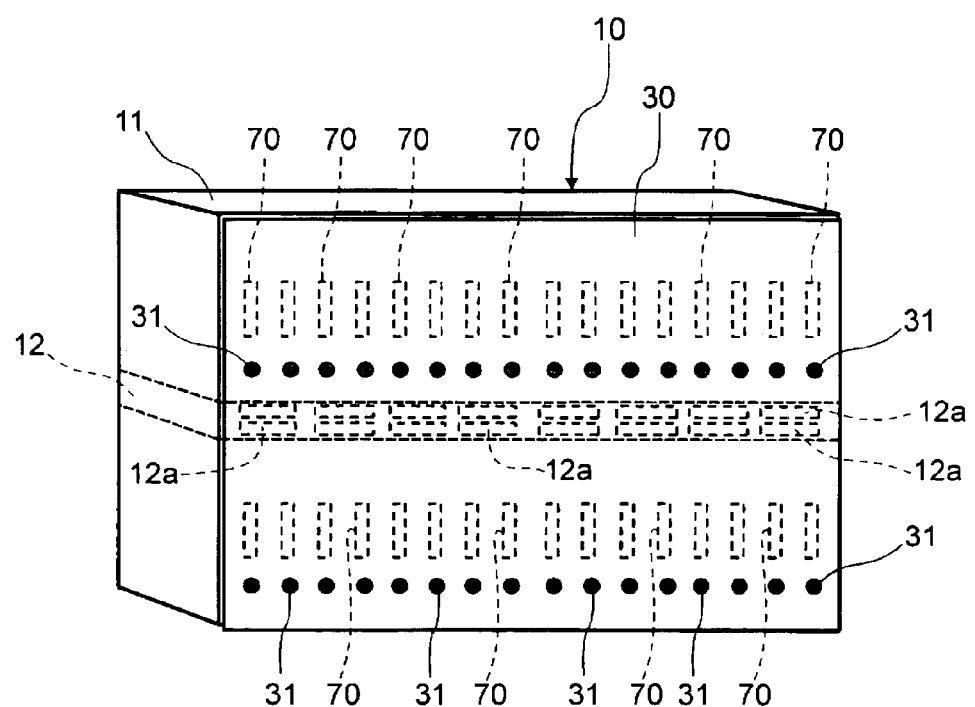
FIG. 7 is a perspective view of the disk drive box, viewed from the back side of a backboard.
Figure 8:
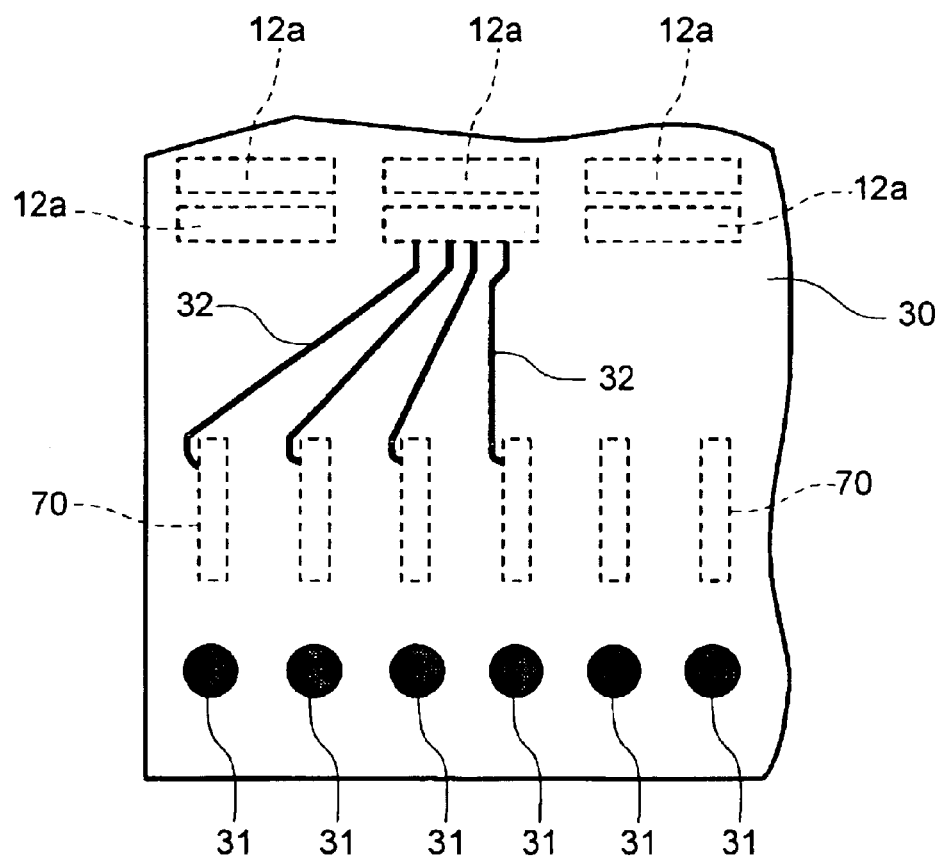
FIG. 8 is a plan view showing an enlarged rear side of the backboard.

Next, the configuration of the backboard 30 is described with reference FIGS. 7 and 8. FIG. 7 is an exterior view of a box 10, viewed from the rear side of the backboard 30 with the heat sinks 50 removed, and FIG. 8 is a plan view showing the backboard depicted in FIG. 7, a portion of which is enlarged.

As shown in FIG. 7, the front face of the backboard 30, which lids the rear of the box 10, is provided with the signal connectors 70 for electrically connecting with the disk drives 20 as well as the signal connectors 12a for electrically connecting with the control board 12. The backboard 30 is also provided with mounting holes 31 formed therein, for attaching the heat sinks 50. In some instances, screw holes may be formed at the four corners of the backboard 30. As clearly seen from FIG. 7, substantially no openings exist in the backboard 30 other than the small-diameter mounting holes 31, and these mounting holes 31 too are closed by the heat sinks 50 fitted thereto. In the present embodiment, the heat pipes and the heat sinks 50 are utilized to transport the heat from the disk drives 20 to the outside of the box 10, and therefore, it is unnecessary to form an opening or openings for cooling in the backboard 30, which has/have been described as the related art. Consequently, as shown in FIG. 8, the wiring pattern 32 for connecting the signal connectors 12a for the control boards 12 and the signal connectors 70 for the disk drives 20 is substantially linearly formed on the backboard 30, which has no openings to be bypassed. The wiring pattern 32 can be formed so that, for example, the routing length of wiring lines becomes short, the loop areas with the wiring lines become small, and wiring lines are not extremely packed with each other densely, taking electrical characteristics into account.

Thus, according to the present embodiment, the heat taken away from the disk drives 20 by the heat-absorbing parts 40 is transmitted to the heat sinks 50 via the heat connectors 60, and the heat is radiated from the heat sinks 50 into the cooling air inside the air duct 7. Therefore, it is unnecessary to supply cooling air in the box 10 to perform natural air cooling or forced air cooling. Accordingly, the disk drives 20 can be accommodated at a high density and the box 10 can be reduced in size. Moreover, because it is unnecessary to provide an opening or openings for air cooling in the backboard 30, the degree of freedom in designing the wiring pattern 32 can be greatly increased.

Figure 9:
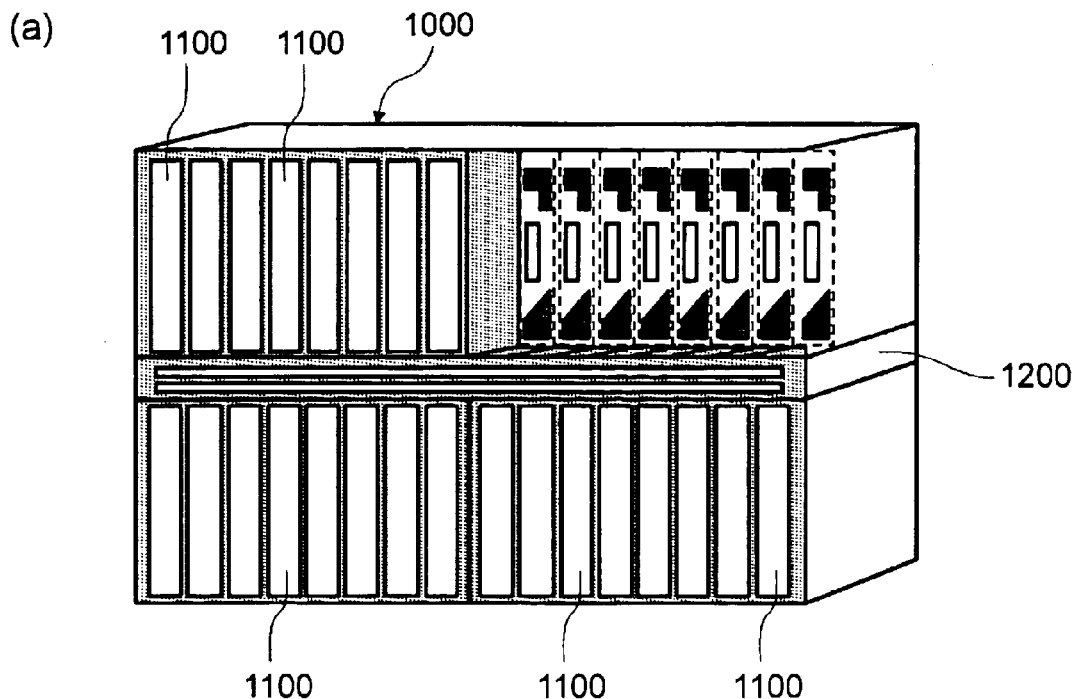
Figure 9:
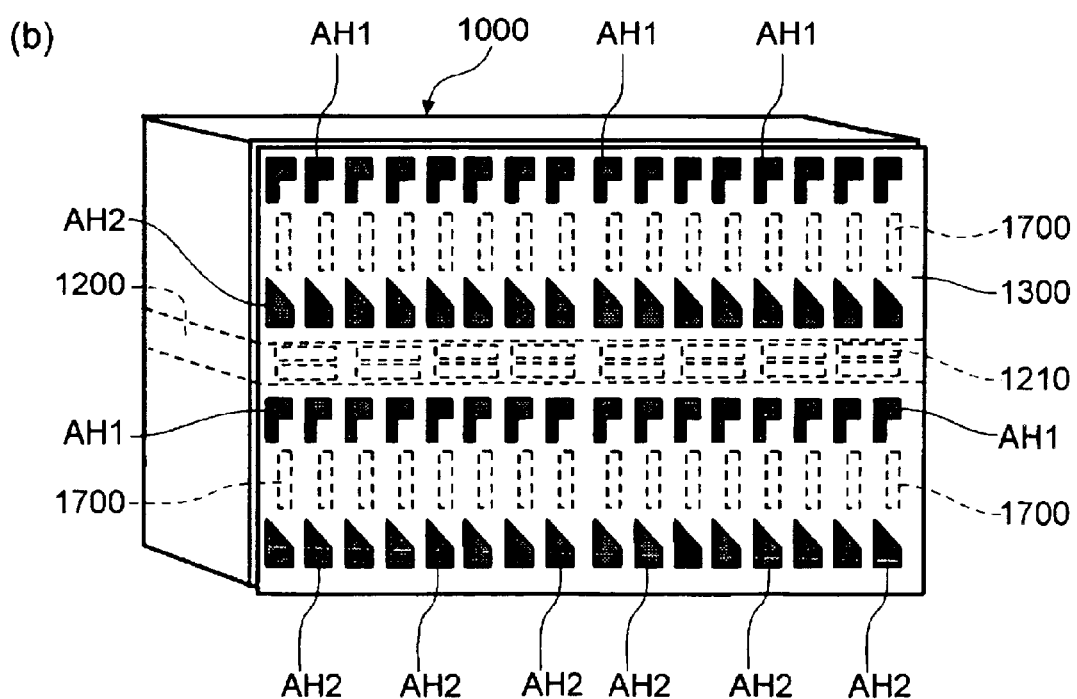
Figure 10:
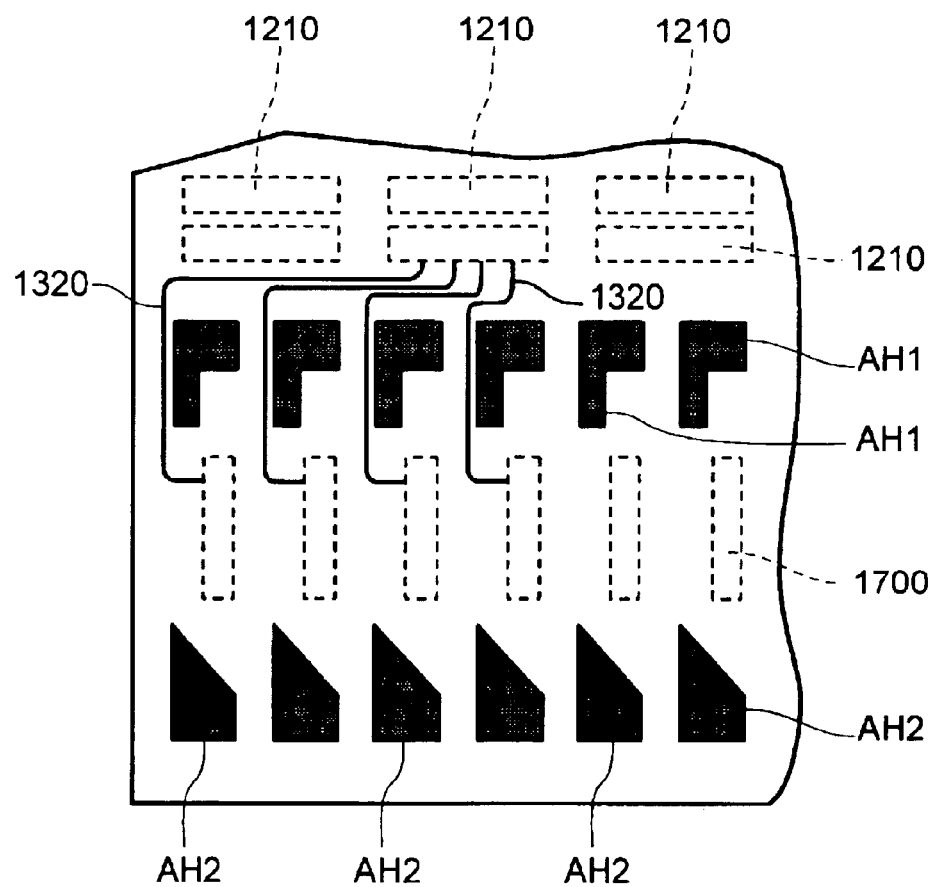
FIG. 10 is a plan view showing a backboard of FIG. 9 enlarged.

With reference to FIGS. 9 and 10, the advantageous effects of the present embodiment will be confirmed. FIG. 9 shows a disk drive box 1000 that is configured with an air cooling system. FIG. 9A is an exterior view of the box 1000 from which some of disk drives 1100 are removed, viewed from the front side, and FIG. 9B is an exterior view of the box 1000, viewed from the rear side. As shown in FIG. 9, if the box 1000 in which the disk drives 1100 are accommodated at a high density is constructed with an air cooling structure, it will be necessary to have clearances between the disk drives 1100 for actively causing cooling air to flow therethrough and also to form a multiplicity of cooling openings AH1 and AH2 in the backboard 1300. For this reason, as shown in FIG. 10, which shows a partially enlarged view, a wiring pattern 1320 for connecting signal connectors 1210 to be connected to a control board 1200 and signal connectors 1700 to be connected to disk drives 1100 must be formed so as to bypass the openings AH1 (or AH2). That is, the reduced area in which the wiring pattern 1320 can be formed and additionally the presence of interfering objects (AH1, AH2) impose design constraints of the wiring pattern 1320, leaving fewer options. This necessitates the wiring pattern 1320 to be routed bypassing the openings AH1 etc. for cooling. It is also likely that the wiring pattern 1320 is extremely packed densely in a small area.

By contrast, with the present embodiment, substantially no such interfering openings for cooling that the wiring pattern needs to bypass exist in the backboard 30. Therefore, the degree of freedom in designing the wiring pattern 32 increases, and it is possible to realize a pattern design which takes electrical characteristics into consideration. Moreover, it is unnecessary to provide clearances for causing cooling air to flow between the disk drives 20 and between the disk drives 20 and the case 11, and the disk drives 20 can be accommodated in such a manner that they are brought into contact as closely as possible; therefore, it is possible to reduce the size of the entire box 10.

[2. Second Embodiment]

Figure 11:
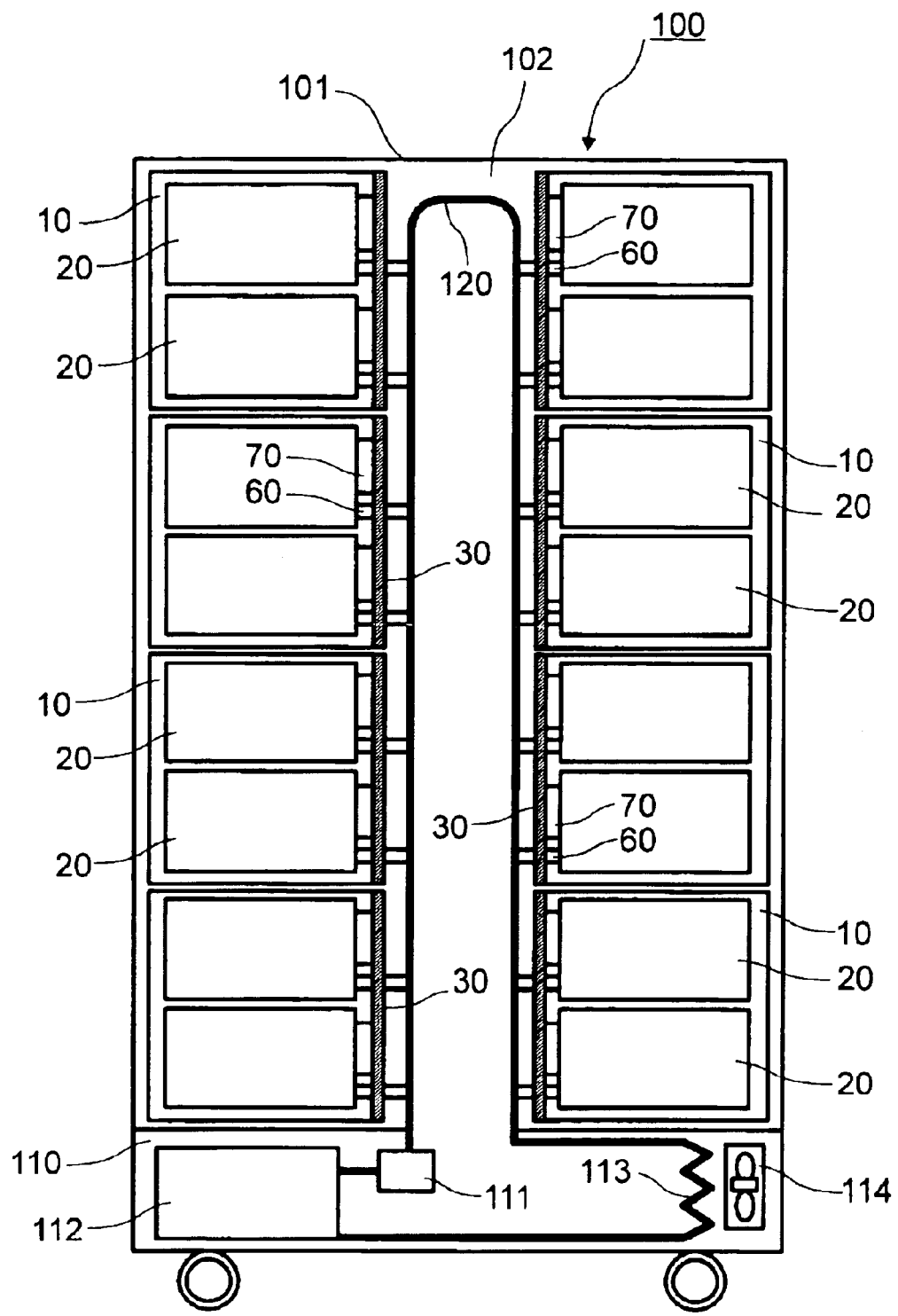
FIG. 11 is a cross-sectional view of a disk array apparatus according to a second embodiment of the invention.

Next, a second embodiment of the invention is described with reference to FIG. 11. A feature of the present embodiment is that the heat radiated from the boxes 10 is cooled by a liquid cooling system. FIG. 11 is a schematic cross-sectional view of a disk array apparatus 100 according to the present embodiment. The configurations of the boxes 10, the disk drives 20, and so forth are similar to those of the foregoing embodiment, and therefore the description is omitted. In the present embodiment, a liquid-cooling system cooling machine room 110 is provided in a lower portion of a rack 101, and a cooling pipe 120 in which refrigerant circulates is laid inside a space 102 that is defined in the rack 101, with the space 102 extending vertically. The heat connectors 60 of the disk drives 20 (more accurately, the heat-dissipating-side heat connectors 62) are respectively connected to the cooling pipe 120 so that they can conduct heat. That is, the present embodiment adopts the cooling pipe 120 in which refrigerant flows, in place of the heat sinks 50.

The cooling machine room 110 is provided with a refrigerant pump 111, a reservoir tank 112, a heat exchanger 113, and a cooling fan 114. The refrigerant pump 111 pumps the refrigerant suctioned from the reservoir tank 112 into the cooling pipe 120. The refrigerant that has flowed in the cooling pipe 120 flows through the cooling pipe 120 while taking heat away from the heat connectors 60, and flows into the heat exchanger 113. The heat of the refrigerant that has flowed in the heat exchanger 113 is cooled by the heat exchanger 113 and returns to the reservoir tank 112.

The present embodiment thus configured too exhibits advantageous effects similar to those of the foregoing embodiment. In addition to those, by adopting the liquid-cooling system cooling structure, the present embodiment eliminates the need for providing an air duct for letting a large amount of cooling air flow therethrough, permitting size reduction of the disk array apparatus 100. Furthermore, it is possible to transport the heat of the disk drives 20 outside more effectively, although it may depend upon the characteristics and flow volume of the refrigerant.

[3. Third Embodiment]

Figure 12:
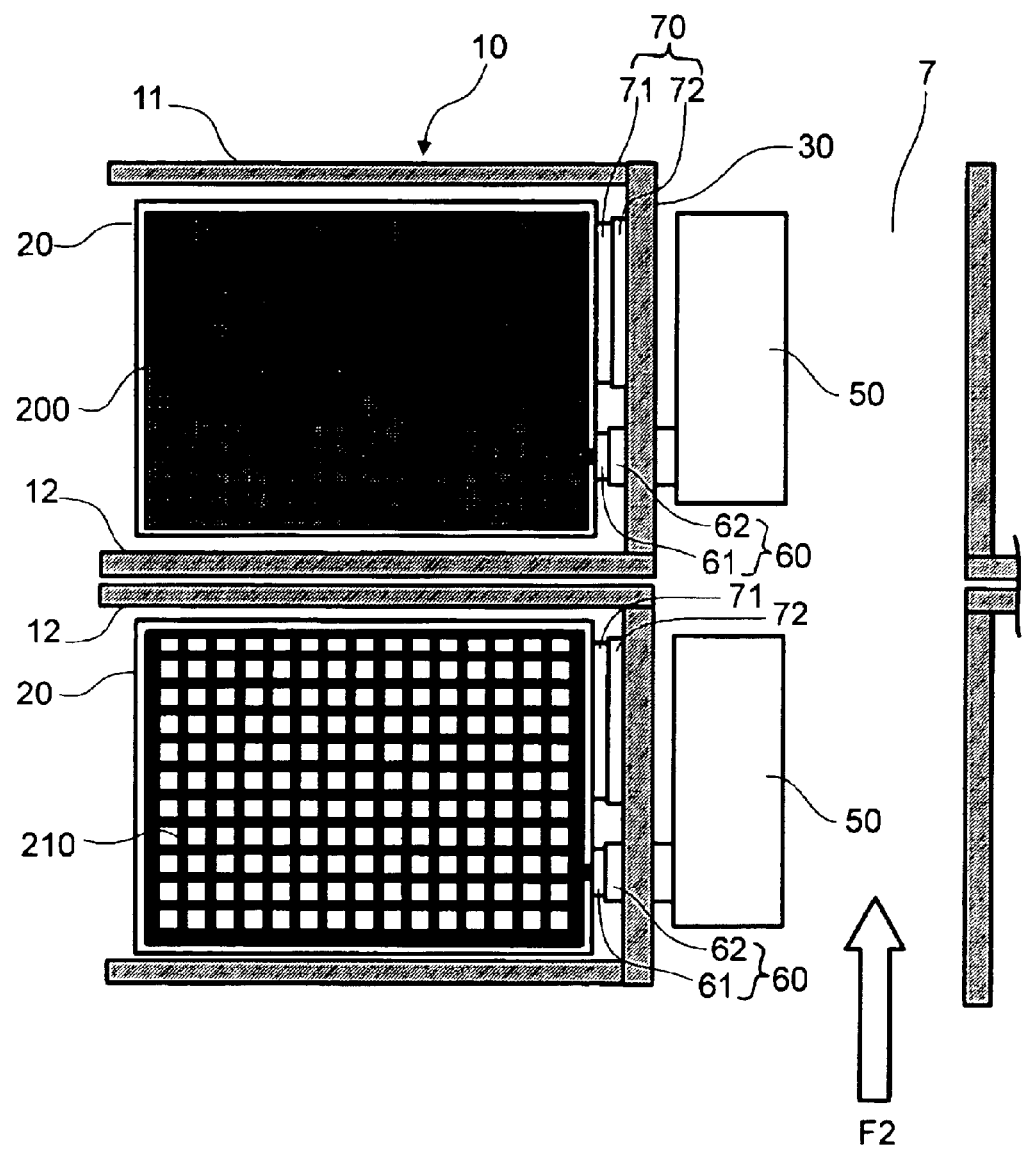
FIG. 12 is a cross-sectional view of a disk drive box according to a third embodiment of the invention, in which the upper portion of the figure shows a case in which a heat-absorbing part is formed into a flat plate shape whereas the lower portion of the figure shows a case in which the heat-absorbing part is formed into a network-like shape, respectively.

Next, a third embodiment of the invention is described with reference to FIG. 12. A feature of the present embodiment is that the shape of the heat-absorbing part is changed. For example, as illustrated in the upper portion of FIG. 12, a heat-absorbing part 200 may be formed into a flat plate shape that covers a side face of a disk drive 20. Alternatively, as illustrated in the lower portion of FIG. 12, a heat-absorbing part 210 may be formed in a network-like shape that covers a side face of a disk drive 20.

It should be noted that the present invention is not limited to the foregoing preferred embodiments. It is recognized that those skilled in the art may make various modifications and additions to the preferred embodiments described above without departing from the scope of the invention. For example, the invention may be applied to electronic devices other than disk drive boxes. In addition, the signal transmission between the backboard and the disk drives may be made by optical communications or wireless communications.

We claim:

1. A cooling structure for a disk storage device accommodating at least one disk drive, comprising:
   the disk storage device having a connection board to which the disk drive is electrically connected such that data input/output to/from the disk drive is performed via a signal line formed on the connection board;
   a heat-absorbing part provided on the disk drive;
   a heat-dissipating part exposed outside the disk storage device; and
   a heat-transferring part for connecting the heat-absorbing part and the heat-dissipating part,
   wherein heat generated by the disk drive is transmitted from the heat-absorbing part via the heat-transferring part to the heat-dissipating part to radiate the heat, whereby an opening for air cooling is substantially eliminated from the connection board, and
   wherein the heat-transferring part separably includes a heat-absorbing-side heat-transferring part coupled to the heat-absorbing part and provided at the disk drive side, and a heat-dissipating-side heat-transferring part coupled to the heat-dissipating part and provided at the connection board side, tooth portions of the heat-absorbing-side heat-transferring part and tooth portions of the heat-dissipating-side heat-transferring part fit together to provide surface contact.

2. The cooling structure for a disk storage device according to claim 1, wherein:
   the disk storage device accommodates a plurality of the disk drives; and substantially no clearance for air cooling exists between the disk drives and between the disk drives and a housing of the disk storage device.

3. The cooling structure for a disk storage device according to claim 1, wherein the heat-absorbing-side heat-transferring part and the heat-dissipating-side heat-transferring part are in surface contact with each other at a plurality of locations to transfer heat.

4. The cooling structure for a disk storage device according to claim 1, wherein the heat-absorbing part is distributedly disposed corresponding to heat producing areas of the disk drive.

5. The cooling structure for a disk storage device according to claim 1, wherein the heat-absorbing part is provided so as to cover a surface of the disk drive.

6. The cooling structure for a disk storage device according to claim 1, wherein the heat-absorbing part includes a heat pipe.

7. The cooling structure for a disk storage device according to claim 1, further comprising a cooling mechanism for removing heat radiated from the heat-dissipating part.

8. The cooling structure for a disk storage device according to claim 7, wherein the cooling mechanism removes heat from the heat-dissipating part by air cooling.

9. The cooling structure for a disk storage device according to claim 7, wherein the cooling mechanism removes heat from the heat-dissipating part by liquid cooling.

10. The cooling structure for a disk storage device according to claim 1, wherein:
   a control board for controlling operation of the disk drive is provided in the disk storage device, the control board being connected to the connection board;
   a signal line for connecting the control board and the disk drive is formed on the connection board; and
   the signal line is formed so as to substantially linearly connect an electrical connector unit between the disk drive and the connection board, with an electrical connector unit between the control board and the connection board.

11. The cooling structure for a disk storage device according to claim 1, wherein:
   a plurality of compartments are formed vertically within a housing of the disk storage device; and
   in each of the compartments, a plurality of the disk drives are disposed substantially in close contact with each other.

12. A disk array apparatus comprising:
   a plurality of disk storage devices for connecting a plurality of disk drives to a connection board having a signal line for electrically connecting the disk drives with each other, and for accommodating the disk drives substantially in close contact with each other;
   a device housing for accommodating the disk storage devices;
   a cooling mechanism provided in the device housing;
   heat-absorbing parts respectively provided for the disk drives;
   at least one heat-dissipating part exposed outside of the disk storage devices; and
   heat-transferring parts each for connecting one of the heat-absorbing parts and the heat-dissipating part with each other,
   wherein heat generated by the disk drives is transmitted from the heat-absorbing parts via the heat-transferring part to the heat-dissipating parts and is radiated from the heat-dissipating part via the cooling mechanism, whereby substantially no opening for air cooling is formed in the connection board, and wherein each of the heat-transferring part, separably includes a heat-absorbing-side heat-transferring part coupled to said one the heat-absorbing parts and provided at the disk drive side, and a heat-dissipating-side heat-transferring part coupled to the heat-dissipating part and provided at the connection board side, tooth portions of the heat-absorbing-side heat-transferring part and tooth portions of the heat-dissipating-side heat-transferring part fit together to provide surface contact.

13. A cooling structure for a unit-accommodating enclosure accommodating at least one unit having a heat producing area inside, comprising:

the unit connected to a connection board on which an information transmission path is formed such that information input/output to/from the unit is performed via the information transmission path;

a heat-absorbing part provided on the unit;

a heat-dissipating part exposed outside the unit-accommodating enclosure; and a heat-transferring part for connecting the heat-absorbing part and the heat-dissipating part;

wherein heat generated by the unit is transmitted from the heat-absorbing part via the heat-transferring part to the heat-dissipating part and is radiated therefrom, whereby an opening for air cooling is substantially eliminated from the connection board, and wherein the heat-transferring part separably includes a heat-absorbing-side heat-transferring part coupled to the heat-absorbing part and provided at the disk drive side, and a heat-dissipating-side heat-transferring part coupled to the heat-dissipating part and provided at the connection board side, tooth portions of the heat-absorbing-side heat-transferring part and tooth portions of the heat-dissipating-side heat-transferring part fit together to provide surface contact.

* * * * *